(12) United States Patent
Ashraf et al.

(10) Patent No.: US 11,037,793 B2
(45) Date of Patent: Jun. 15, 2021

(54) METHOD OF PLASMA ETCHING

(71) Applicant: SPTS Technologies Limited, Newport (GB)

(72) Inventors: Huma Ashraf, Newport (GB); Kevin Riddell, Newport (GB); Alex Wood, Newport (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 16/447,851

(22) Filed: Jun. 20, 2019

(65) Prior Publication Data

US 2019/0393044 A1 Dec. 26, 2019

(30) Foreign Application Priority Data

Jun. 25, 2018 (GB) .................................... 1810387

(51) Int. Cl.
| | |
|---|---|
| *H01L 21/67* | (2006.01) |
| *H01L 21/3213* | (2006.01) |
| *H01L 21/311* | (2006.01) |
| *H01L 21/308* | (2006.01) |
| *H01L 21/3065* | (2006.01) |
| *H01L 21/306* | (2006.01) |
| *H01L 21/02* | (2006.01) |

(52) U.S. Cl.
CPC .... *H01L 21/3065* (2013.01); *H01L 21/02378* (2013.01); *H01L 21/306* (2013.01); *H01L 21/308* (2013.01); *H01L 21/30604* (2013.01); *H01L 21/30655* (2013.01); *H01L 21/311* (2013.01); *H01L 21/31116* (2013.01); *H01L 21/32136* (2013.01); *H01L 21/32137* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 6,051,503 A | 4/2000 | Bhardwaj | |
| 2007/0281462 A1 | 12/2007 | Kawada | |
| 2008/0090424 A1 | 4/2008 | You et al. | |
| 2008/0293240 A1 | 11/2008 | Kawada | |
| 2011/0016577 A1 | 1/2011 | Narvel et al. | |
| 2012/0319101 A1 | 12/2012 | Sasagawa et al. | |
| 2013/0115772 A1* | 5/2013 | Oishi | H01L 21/30655 438/694 |
| 2016/0013063 A1* | 1/2016 | Ranjan | H01L 21/32136 438/714 |
| 2016/0293432 A1* | 10/2016 | Ranjan | H01J 37/32963 |
| 2018/0114700 A1 | 4/2018 | Woo et al. | |
| 2018/0130669 A1 | 5/2018 | Lane et al. | |

* cited by examiner

*Primary Examiner* — Stephanie P Duclair
(74) *Attorney, Agent, or Firm* — Hodgson Russ LLP

(57) ABSTRACT

According to the invention there is provided a method of plasma etching a silicon-based compound semiconductor substrate, the method comprising providing the substrate within an etch chamber and performing a cyclical process on the substrate, each cycle comprising supplying an etchant gas into the chamber, energising the gas into a plasma, and performing an etch step on the substrate using the plasma; and performing a desorption step, wherein during the desorption step, the only gas that is supplied into the etch chamber is an inert gas, so as to allow reactive species that have adsorbed to the surface of the substrate during the etch step to desorb from the surface of the substrate.

21 Claims, 4 Drawing Sheets

METHOD OF PLASMA ETCHING

TECHNICAL FIELD

The present invention relates to a method of plasma etching, particularly a method of plasma etching a silicon-based compound semiconductor substrate.

BACKGROUND

Micro-trenching is a term used to refer to localised etching at the base of the sidewalls of plasma etched features, which can lead to large differences in the etch depth across the bottom of the feature. Micro-trenching can be caused when etching ions arrive at the sidewalls at grazing angles. These ions reflect off the sidewalls and accumulate at the corners of the trench, leading to a localised higher etch rate. FIG. 4 shows a typical micro-trenched structure during plasma etching of SiC using $SF_6/O_2$/He process gases. Micro-trenching is undesirable because it can lead to defective semiconductor devices, especially if the micro-trenches reach through to the underlying electrodes.

Typical methods for preventing micro-trenching rely either on adjusting the DC self-bias to reduce the ion energy, or the use of a polymerisation gas (e.g. $SiF_4$, $C_4F_8$, $CHF_3$). However, these methods do not always guarantee prevention of a micro-trenching, and depending on the etch requirements can result in a less than ideal etch performance, such as a low etch rate or selectivity. Use of a polymer forming gas can also have a detrimental effect on the cleanliness of the etch chamber, such that the chamber requires frequent mechanical cleaning.

US 2007/0281462 discloses a method for overcoming the problem of micro-trenching, wherein a first plasma etching step is followed by a second plasma etching step to remove any micro-trenches created during the first plasma etching step.

An object of the present invention is to prevent, or at least reduce, micro-trenching during plasma etching.

SUMMARY OF INVENTION

According to an aspect of the invention, there is provided a method of plasma etching a silicon-based compound semiconductor substrate, the method comprising:
(a) providing the substrate within an etch chamber;
(b) performing a cyclical process on the substrate, each cycle of the cyclical process comprising:
   i. supplying an etchant gas into the etch chamber, energising the etchant gas into a plasma and performing an etch step on the substrate using the plasma; and
   ii. performing a desorption step, wherein during the desorption step, the only gas that is supplied into the etch chamber is an inert gas, so as to allow reactive species that have adsorbed to the surface of the substrate during the etch step to desorb from the surface of the substrate.

The inventors have found that by providing a desorption step in which the flow of any reactive species into the etch chamber is stopped and only an inert gas is supplied into the chamber for a predetermined amount of time before moving on to the next step or cycle, micro-trenching can be substantially reduced or eliminated entirely. It is postulated that the desorption step provides time for any reactive species to desorb from the surface of the substrate, thereby reducing the number of reactive species below threshold levels required for micro-trench formation.

In this way, micro-trenching can be reduced or eliminated without the need for polymerisation gases to create a passivation layer, which, as explained above, can have a detrimental effect on chamber cleanliness.

The term "compound semiconductor" refers to a semiconductor made from two or more elements. The term "silicon-based compound semiconductor" refers to a compound semiconductor in which one of the elements is silicon.

During the etch step, the etchant gas may comprise a fluorine-containing gas. For example, the etchant gas may comprise sulfur hexafluoride ($SF_6$). Alternatively, or in addition, the etchant gas may comprise $CF_4$ or $C_4F_8$. The fluorine-containing gas provides a source of fluorine radicals in the plasma, which react at the surface of the substrate to perform the etch.

The flow rate of the fluorine-containing gas during the etch step may be about 10-50 sccm (standard cubic centimetres per minute).

The duration of the etch step in each cycle may be about 0.5-5 seconds.

The etchant gas may further comprise an inert gas, e.g. helium, argon, krypton or xenon. The flow rate of the inert gas during the etch step may be about 15-40 sccm.

In some embodiments, the etchant gas consists of a fluorine-containing gas (e.g. $SF_6$) and an inert gas (e.g. He, Ar, Kr or Xe), i.e. the only gases supplied to the etch chamber during the etch step are a fluorine-containing gas and an inert gas.

In some embodiments, the etchant gas may further comprise an oxygen-containing gas (e.g. $O_2$ or $O_3$). The flow rate of the oxygen-containing gas may be less than the flow rate of the fluorine-containing gas. The oxygen-containing gas may flow during the etch step for only a portion of the total time of the etch step, and/or for only a subset of the total number of cycles.

During the desorption step, the inert gas supplied to the etch chamber may be, for example, helium, argon, krypton or xenon, or a mixture of inert gases. The flow rate of the inert gas during the desorption step may be about 15-40 sccm.

The duration of the desorption step in each cycle may be at least 0.5 seconds. In some embodiments, the duration of the desorption step may be at least 1 second. In some embodiments, the duration of the desorption step may be at least 1.5 seconds. In some embodiments, the duration of the desorption step may be at least 2 seconds. The maximum duration will be driven by productivity considerations but may, for example, be about 5 seconds. The duration of the desorption step may, for example, be about 0.5-5 seconds. A shorter desorption step will result in a faster cycle, but micro-trenching may return or the degree of micro-trenching may be unacceptable if the desorption step is too short.

A mask layer, e.g. a $SiO_2$ mask layer, for protecting areas of the substrate that are not to be etched during the etch step may be provided on the substrate prior to performing the cyclical process. In this case, each cycle of the cyclical process may further comprise:
iii. performing a mask fortification step for fortifying the mask layer, wherein during the mask fortification step, only an oxygen-containing gas and optionally an inert gas is supplied into the etch chamber;
wherein the etch step, the desorption step and the mask fortification step may be performed in any order during each cycle.

The mask fortification step is not essential for reducing micro-trenching and generally does not affect the extent of micro-trenching. However, by providing a mask fortification step, deterioration of the mask layer can be mitigated during each cycle, thereby allowing for greater etch depths.

The steps do not need to be performed in any particular order. For example, in one embodiment, the etch step may be performed first, followed by the desorption step, followed by the mask fortification step. In another embodiment, the etch step may be performed first, followed by the mask fortification step, followed by the desorption step. In a further embodiment, the desorption step may be performed first, followed by the etch step, followed by the mask fortification step.

During the mask fortification step, the oxygen-containing gas may be $O_2$ or $O_3$.

In an embodiment, the gas supplied to the etch chamber during the mask fortification step consists of an oxygen-containing gas (e.g. $O_2$ or $O_3$) and optionally an inert gas, e.g. helium, argon, krypton or xenon. If an inert gas is supplied during the mask fortification step, the flow rate of the inert gas during the mask fortification step may be about 15-40 sccm.

The flow rate of the oxygen-containing gas during the mask fortification step may be less than or equal to 30 sccm. In some embodiments, the flow rate of the oxygen-containing gas during the mask fortification step may be less than or equal to 25 sccm. In some embodiments, the flow rate of the oxygen-containing gas during the mask fortification step may be less than or equal to 20 sccm. In some embodiments, the flow rate of the oxygen-containing gas during the mask fortification step may be less than or equal to 15 sccm. In some embodiments, the flow rate of the oxygen-containing gas during the mask fortification step may be about 3-12 sccm.

The duration of the mask fortification step in each cycle may be about 0.5-5 seconds.

The method of the invention may be a method of plasma etching a silicon-based compound semi-conductor substrate, wherein the substrate is made of SiC.

BRIEF DESCRIPTION OF THE DRAWINGS

The invention will now be described, by way of example only, with reference to the accompanying drawings, in which.

DETAILED DESCRIPTION

Figure 1:
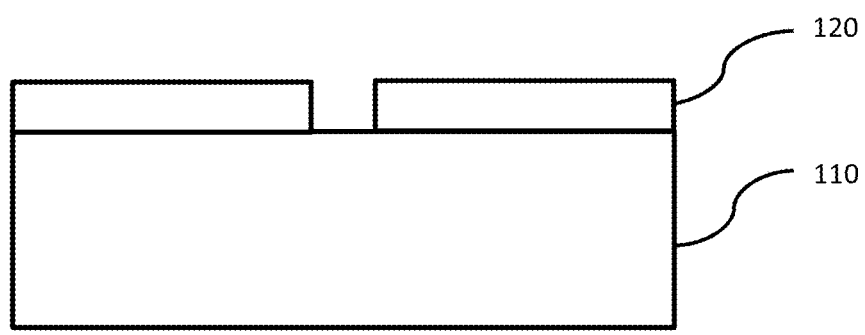
FIG. 1 shows a schematic diagram of a substrate on which the method of the invention may be performed.

FIG. 1 shows a substrate 110 to be etched using the method of the invention. Substrate 110 in this example is made from silicon carbide (SiC). On top of substrate 110 is a mask 120 made from silicon dioxide ($SiO_2$). During the etching process, the etch rate of mask 120 will be lower than the etch rate of substrate 110 due to the difference in materials. Mask 120 thus acts as a barrier over substrate 110 to protect portions of substrate 110 that are not to be etched. Portions of substrate 110 that are to be etched are left exposed on the top.

Substrate 110 is etched in a typical plasma etching apparatus (not shown) comprising an etch chamber in which substrate 110 is supported on a platen. An exemplary high density plasma etch tool which could etch an SiC substrate would be an SPTS Omega® Synapse™. The etch chamber comprises a gas inlet through which gases can be introduced into the chamber, and a gas outlet through which gases can exit the chamber.

Figure 2:
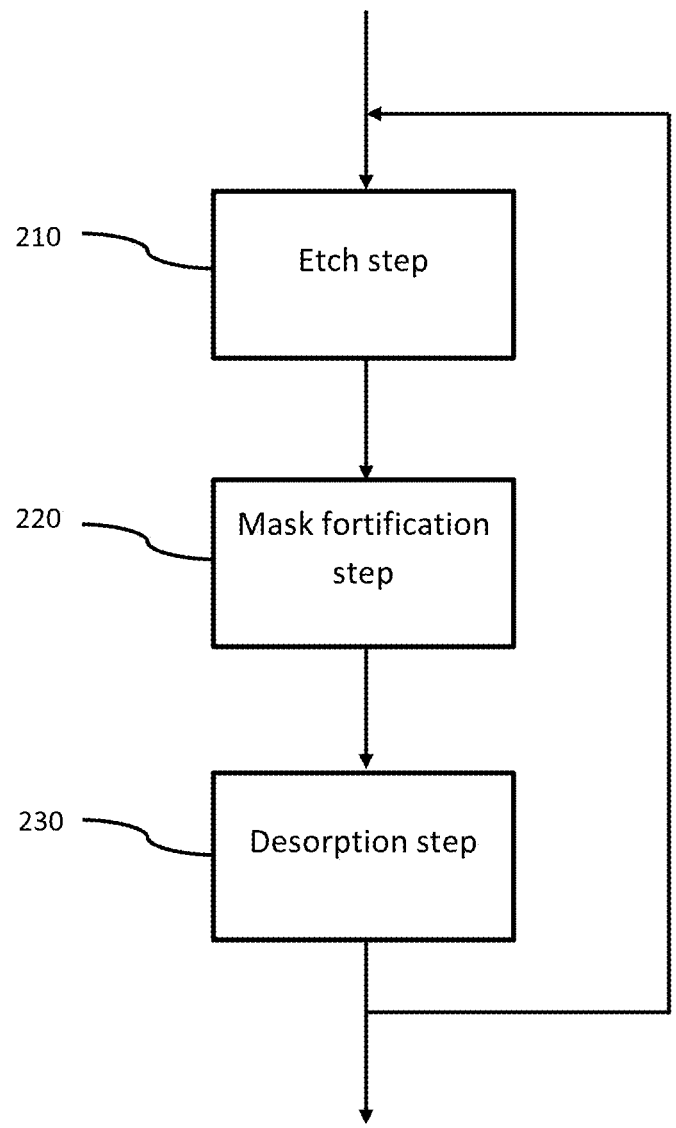
FIG. 2 shows a schematic diagram of a cyclical process in accordance with the invention.

FIG. 2 shows a flow diagram of an example cyclical process according to the invention. In this described embodiment, an etch step 210 is performed first, followed by a mask fortification step 220, followed by a desorption step 230. However, the steps do not need to be performed in this order and can be rearranged in any order. Furthermore, mask fortification step 220 is optional for the purposes of reducing or preventing micro-trenching. Mask fortification step 220 advantageously allows a greater etch depth to be achieved.

Table 1 shows typical parameters of each step. Typical operational pressures would be 1-50 mTorr (approximately 0.13-6.67 Pa) and a typical RF bias power would be 250-1000 W.

TABLE 1

|  | Step 210 (etch) | Step 220 (mask fortification) | Step 230 (desorption) |
| --- | --- | --- | --- |
| Time (s) | 0.5-5 | 0.5-5 | 0.5-5 |
| Coil power (W) | 500-1500 | 500-1500 | 500-1500 |
| $SF_6$ (sccm) | 10-50 | 0 | 0 |
| $O_2$ (sccm) | 0 | 3-12 | 0 |
| He (sccm) | 15-40 | 15-40 | 15-40 |

During etch step 210, an etchant gas mixture of $SF_6$ and He is supplied to the etch chamber. The etchant gas mixture is then energised into plasma and used to etch a portion of substrate 110 to begin to form a trench. Although in this example there is no flow of $O_2$ during the etch step 210, in some embodiments, the etchant gas mixture may further comprise $O_2$. The addition of $O_2$ during the etch step may increase the F* radicals and therefore advantageously increase the etch rate. However, an increase in F* radicals will also make micro-trenching more likely to occur. If $O_2$ is to be incorporated into the etchant gas mixture, the flow rate of $O_2$ may typically be less than the flow rate of $SF_6$. In some embodiments, $O_2$ may only be added during a portion of the total time for the etch step 210 and/or for only a subset of the total number of cycles. The flow rate of $O_2$ and the duration of the flow of $O_2$ during the etch step 210 may be optimised to increase the etch rate without micro-trenching occurring.

During mask fortification step 220, supply of $SF_6$ to the etch chamber is stopped and a gas mixture of $O_2$ and He is supplied to the etch chamber instead. The $O_2$ gas encourages the formation of compounds to fortify mask layer 120 so that the trench can be etched to a greater depth. This step does not have a significant effect on micro-trenching and is optional.

During desorption step 230, the only gas supplied to the etch chamber is He. Supplying only an inert gas during this step allows time for any reactive etch species that have adsorbed to the etched surface of substrate 110 to desorb from the surface, which reduces micro-trenching.

For the desorption step, increasing the flow rate of He does not have a major effect on reducing micro-trenching. The step time of the desorption step is the more important factor for reducing micro-trenching. Increasing the step time of the desorption step leads to reduced or no micro-trenching; however, this comes at the cost of increased overall time to perform each cycle. Desorption step times of over 2 seconds typically result in a micro-trench free etch.

Steps 210, 220 and 230 form one cycle, which can be repeated until the desired etch depth has been reached. For example, using the process parameters shown in Table 1, the process can be repeated for 20 cycles to produce a trench having a depth of approximately 1 µm. Greater etch depths may be achieved using the invention while reducing or preventing micro-trenching.

Figure 3:
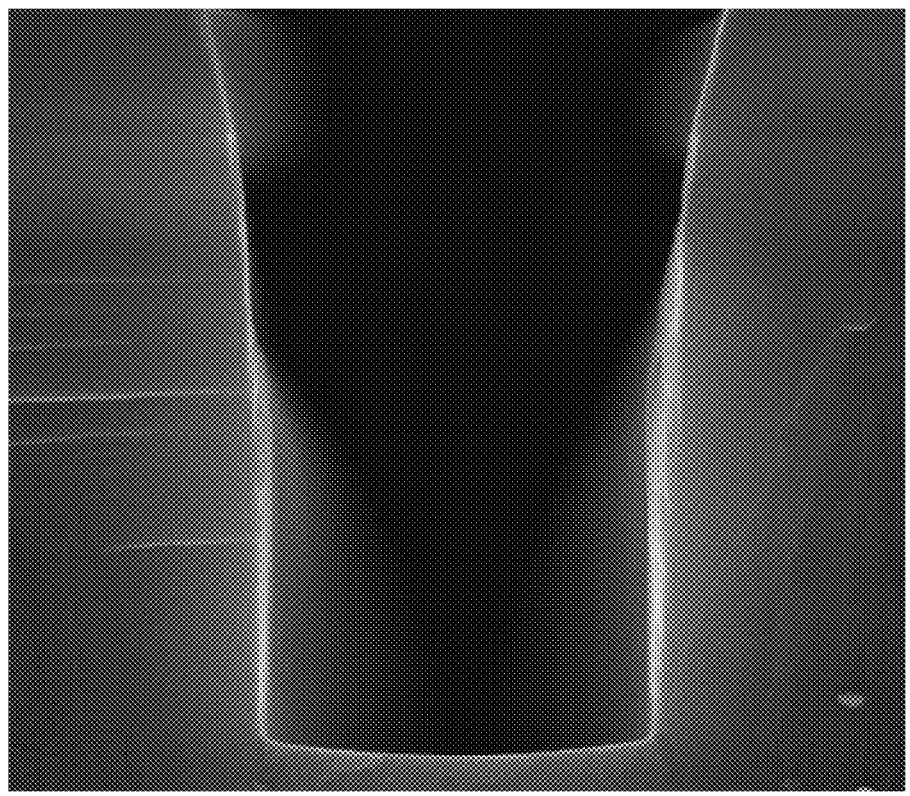
FIG. 3 shows a cross-section of a plasma-etched trench using a method according to the invention.
Figure 4:
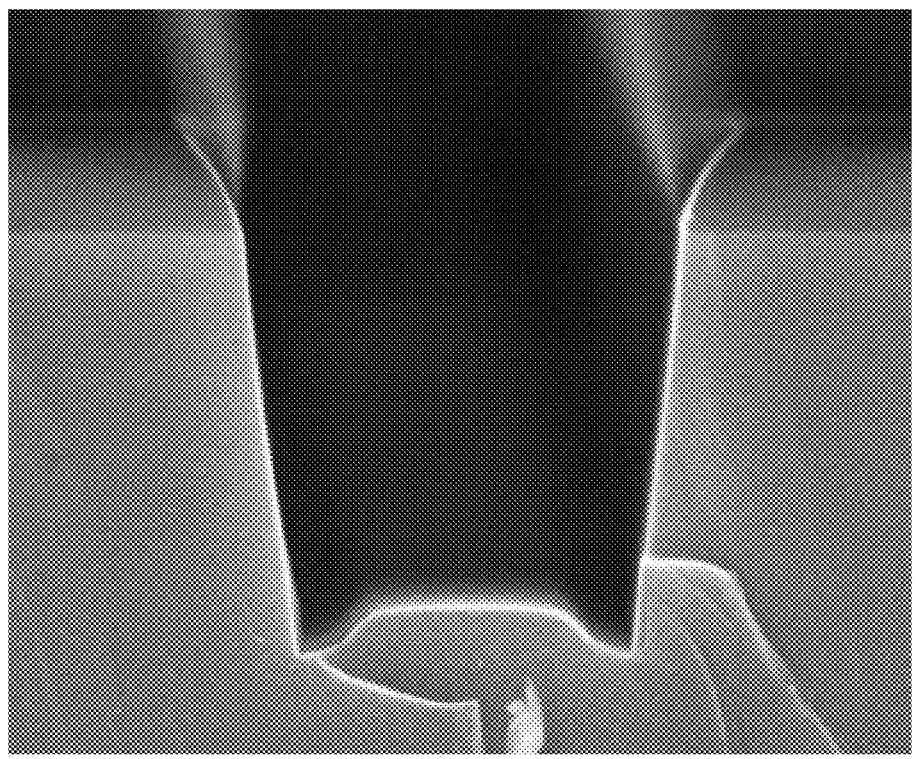
FIG. 4 shows a cross-section of a plasma-etched trench where micro-trenching has occurred.

FIG. 3 shows a cross-section of a trench that was plasma-etched using a 3-step cyclical process according to the invention using the process parameters of Table 1. The illustrated trench shows no micro-trenching.

The invention claimed is:

1. A method of plasma etching a silicon-based compound semiconductor substrate, the method comprising:
 (a) providing the substrate within an etch chamber;
 (b) performing a cyclical process on the substrate, each cycle of the cyclical process comprising:
  i. supplying an etchant gas into the etch chamber, energising the etchant gas into a plasma during continuous flow of the etchant gas and performing an etch step on the substrate using the plasma, wherein a duration of the etch step in each cycle is about 0.5-5 seconds and an RF bias power during the etch step is from 250 W to 1000 W; and
  ii. performing a desorption step with an inert plasma, wherein during the desorption step, the only gas that is supplied into the etch chamber is an inert gas, so as to allow reactive species that have adsorbed to the surface of the substrate during the etch step to desorb from the surface of the substrate, wherein an RF bias power during the desorption step is from 250 W to 1000 W.

2. The method according to claim 1, wherein the etchant gas comprises a fluorine-containing gas.

3. The method according to claim 2, wherein the flow rate of the fluorine-containing gas during the etch step is about 10-50 sccm.

4. The method according to claim 2, wherein the fluorine-containing gas is $SF_6$.

5. The method according to claim 1, wherein the etchant gas further comprises an inert gas.

6. The method according to claim 5, wherein the flow rate of the inert gas during the etch step is about 15-40 sccm.

7. The method according to claim 5, wherein the inert gas in the etchant gas is He.

8. The method according to claim 1, wherein the etchant gas consists of $SF_6$ and an inert gas.

9. The method according to claim 1, wherein the duration of the etch step in each cycle is from 2 seconds to about 5 seconds.

10. The method according to claim 1, wherein the inert gas supplied during the desorption step is He.

11. The method according to claim 1, wherein the flow rate of the inert gas during the desorption step is about 15-40 sccm.

12. The method according to claim 1, wherein the duration of the desorption step in each cycle is about 0.5-5 seconds.

13. The method according to claim 1, wherein the duration of the desorption step in each cycle is at least 2 seconds.

14. The method according to claim 1, wherein a $SiO_2$ mask layer for protecting areas of the substrate that are not to be etched during the etch step is provided on the substrate prior to performing the cyclical process; and wherein each cycle of the cyclical process further comprises:
 iii. performing a mask fortification step for fortifying the mask layer, wherein during the mask fortification step, only an oxygen-containing gas and optionally an inert gas is supplied into the etch chamber;
 wherein the etch step, the desorption step and the mask fortification step may be performed in any order during each cycle.

15. The method according to claim 14, wherein the oxygen-containing gas supplied during the mask fortification step is $O_2$ or $O_3$.

16. The method according to claim 14, wherein during the mask fortification step, the gas supplied to the etch chamber consists of $O_2$, and optionally an inert gas.

17. The method according to claim 14, wherein the flow rate of the oxygen-containing gas during the mask fortification step is less than or equal to 30 sccm.

18. The method according to claim 14, wherein the flow rate of the oxygen-containing gas during the mask fortification step is about 3-12 sccm.

19. The method according to claim 14, wherein the duration of the mask fortification step in each cycle is about 0.5-5 seconds.

20. The method according to claim 1, wherein the substrate is made of SiC.

21. The method according to claim 1, wherein the cyclical process removes at least 1 µm of the semiconductor substrate.

* * * * *